Dec. 19, 1967 S. KAYE ET AL 3,359,137

SOLAR CELL CONFIGURATION

Filed March 19, 1964

STEPHEN KAYE,
LOUIS GARASI,
INVENTORS.

BY THEIR ATTORNEYS.

Spensley & Horn.

United States Patent Office 3,359,137

Patented Dec. 19, 1967

3,359,137

SOLAR CELL CONFIGURATION

Stephen Kaye, Pasadena, and Louis Garasi, Los Angeles, Calif., assignors to Electro-Optical Systems, Inc., Pasadena, Calif., a corporation of California Filed Mar. 19, 1964, Ser. No. 353,186
3 Claims. (Cl. 136—89)

ABSTRACT OF THE DISCLOSURE

A solar cell wherein the rear surface of a semiconductor crystal body is highly doped to form a first surface region of the same conductivity type. A second thin, highly doped, light gathering surface region of the opposite conductivity type extends across all but a small perimetric portion of the front surface, the semiconductor bulk material defining an intermediate region having a pillar-like edge portion terminating in the front surface to provide a back contact at the front surface of the device.

*Disclosure*

In the usual type of solar cell wherein one region of a predetermined conductivity type is separated from another region of the opposite conductivity type by a junction forming a barrier in the nature of an electric field, the external electrical circuitry is connected across the junction. As light passes through both regions it creates pairs of electrons and holes in each, and the field at the junction drives the positive charges to the P side of the junction and the electrons to the N side, electrons then flowing from the N side through the external circuitry to recombine with "holes" on the P side, this current flow providing electric power. However, there has been recently developed a solar cell which utilizes the so-called "lateral photovoltaic effect" to provide a current flow across a region and parallel to the junction, rather than across the junction. The present invention techniques are directed specifically toward the aforementioned usual type of solar cell wherein the external electrical circuit is completed across the junction.

At the state of the art upon filing of this application, the back contact was either made directly to the obverse side of the solar cell, or to a metal tab extending from the obverse side of the cell around an end or side of the cell and terminating near the front surface of the cell. These methods of making back contacts possess several inherent disadvantages, particularly in missile and space satellite applications where minimum space and weight concurrent with high relatability are important factors. For such applications it is the usual practice to fabricate solar cells from single unitary semiconductor crystal bodies of rectangular shape having dimensions on the order of 1 x 2 cm. or 2 x 2 cm. and 15–20 thousandths of an inch thick. A great number of such solar cells are placed together with their front surfaces aligned in the same direction so as to provide an approximation of a single large light gathering surface. The solar cells are typically maintained in this alignment by cementing them to a supporting surface of insulating material. The PN junction in these solar cells is substantially parallel to the front and rear surfaces of the cell, the front and rear surfaces being provided with appropriate metallized regions to define the electrical front and back contacts for conductive connections to an external circuit. Since the rear surface of the cell is cemented to the insulative supporting sheet, each cell is provided with a metal tab which extends from the rear contact, around the cell and projects slightly past the light gathering front surface of the cell, whereby all the electrical contacts to the cell are made at the front surfaces. To prevent electrical short circuiting each metal tab is sandwiched between sheets of insulating material disposed between adjacent cells, the sheets of insulating material providing the dual function of insulating the metal tab from the front and side surfaces of the cells and insulating adjacent cells from each other. The thickness of the metal tab and two insulating sheets between adjacent cells dictate a minimum cell spacing on the order of 35 to 40 mils. Electrical connection to the projecting metal tab back contacts is by soldering.

The main disadvantages inherent in the hereinabove explained prior art technique are a relatively low packing density and current collection efficiency, resulting from the necessarily wide cell spacing. Also, since common solder absorbs radiation of wave lengths greater than about 1.1 micron, the solder contributes a heating effect upon exposure of the cells to infrared radiation. This heating effect is undesirable since an increase in cell temperature results in a decrease in power conversion efficiency. In addition, the weight and volume of the solder can become significant in the aforementioned missile and space satellite applications. A further disadvantage of the aforementioned prior art technique is the difficulty of repair resulting from a solar cell configuration in which the back contact of the cell is at its rear surface, this surface being inaccessible when the cell is cemented in the matrix.

The present invention is directed toward overcoming all of these enumerated disadvantages by providing a solar cell configuration having all electrical contacts on the light gathering front surface thereof, thereby enabling a much higher packing density and eliminating the use of metal tabs and soldered connections.

Accordingly, it is an object of the present invention to provide an improved solar cell configuration.

It is also an object of the present invention to provide an improved solar cell configuration wherein all electrical contacts are made to the light gathering front surface of the cell.

It is another object of the present invention to provide an improved solar cell configuration enabling a high packing density of solar cells in a matrix.

It is yet another object of the present invention to provide an improved solar cell configuration characterized by low series resistance.

It is a still further object of the present invention to provide an improved solar cell configuration characterized by high current collection efficiency.

The objects of the present invention are accomplished by a new solar cell configuration in which a unitary semiconductor crystal body is provided with front and back surface regions of particular shapes and characteristics. A first surface region extends across the entirety of the rear surface of the crystal body, this first region being of the same conductivity type as the bulk of the crystal body and being highly doped. A second thin surface region extends across all but a small portion of the front surface of the crystal body, with the remainder of the crystal body defining a third region contiguous with and separating the first and second regions and having a pillar like portion terminating in the front surface, the second region being a highly doped region of the opposite conductivity type and sufficiently thin to be appreciably transparent to solar radiation. Ohmic contact to this second region provides the front contact of the solar cell, back contact to the solar cell being provided by ohmic connection to the end of the pillar like portion of the third region terminating at the front surface of the crystal body. The highly doped first region has a low sheet resistance to facilitate current flow through the third region to the pillar like portion to thereby provide a low resistance path to the back contact at the end of the pillar like portion. Thus, both the front and back electrical contacts are disposed at the light gathering front surface of the cell, without the necessity of an external electrical connection extending to the rear surface of the crystal body.

The novel features which are believed to be characteristic of the invention, both as to its organization and method of operation, together with further objects and advantages thereof will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

Figure 1:
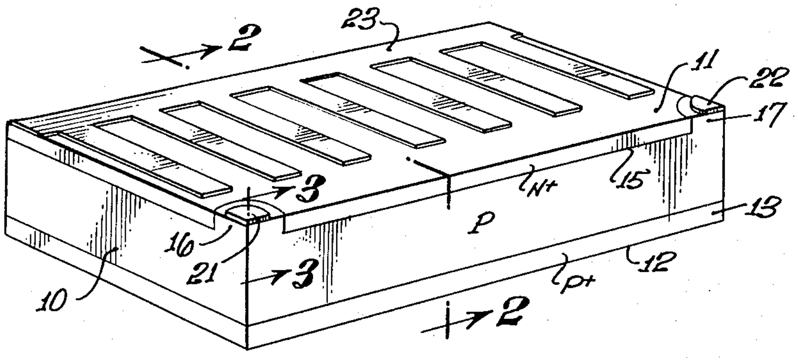
FIGURE 1 is a perspective view of a presently preferred embodiment of the present invention solar cell configuration.
Figure 2:
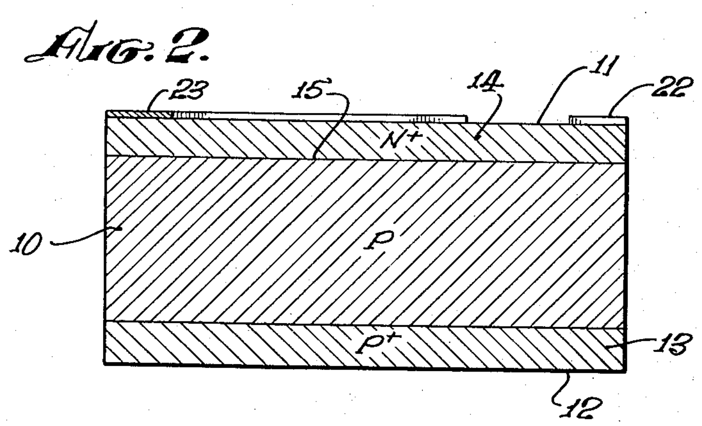
FIGURE 2 is a transverse sectional view taken along the line 2—2 of FIGURE 1; and, FIGURE 3 is a fragmentary sectional view taken along the line 3—3 of FIGURE 1.
Figure 3:
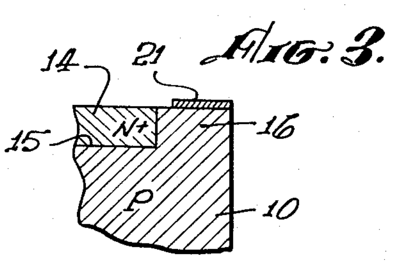

Turning now to the drawing, in FIGURES 1, 2 and 3 there are shown various views of a presently preferred embodiment of the present invention solar cell configuration. The cell is formed from a unitary silicon crystal body 10 of P type conductivity, the body being of rectangular shape and defining a front surface 11 and a rear surface 12. The body 10 includes a $P^+$ type surface region 13 extending across the entirety of the rear surface 12 and an $N^+$ type surface region 14 extending across all but a small portion of the front surface 11, the $N^+$ type surface region 14 being separated from the bulk material of the crystal body 10 by a rectifying barrier or junction 15. The surface regions 13 and 14 are formed by diffusing active impurity atoms into the appropriate crystal surfaces. For example, the surface region 13 can be created by boron diffusion into the rear surface 12, and the surface region 14 by phosphorus diffusion into the front surface 11. When performing the phosphorus diffusion a suitable masking or shielding technique is employed to prevent the introduction of phosphorus atoms into two sector like corner portions of the crystal front surface 11 so that two pillar like corner portions 16 and 17 of the bulk P type semiconductor material will terminate at the front surface 11. Thus it is seen that the majority of the rectifying junction 15 will be substantially parallel to the front and rear crystal surfaces with only two small arcuate portions extending generally perpendicular thereto to the front surface 11. Although a sharp linear junction is not obtained by the diffusion process, the general positions of the various junctions are shown in the drawing by lines for ease of illustration and description. The surface region 14 must be sufficiently thin to be appreciably transparent to solar radiation, the actual thickness and resistivity of this region being readily determinable in accordance with well known solar cell fabrication techniques. The sheet resistance of the $P^+$ surface region 13 must not be in excess of about 5 ohms per square, this low sheet resistance being necessary to insure the efficient flow of current over to the pillar like portions 16 and 17, to thereby provide a low resistance path to the device back contact.

Back contact to the solar cell is provided by establishing metallized regions 21 and 22 at the corners of the front surface 11 within the sector shaped ends of the P type pillars 16 and 17. Front contact to the surface region 14 is provided by establishing a metallized region 23 of comb-like configuration on the front surface 11, such comb-like configurations being a well known expedient in the art to collect current across the front surface of solar cells. The metallized regions 21, 22 and 23 can be formed by electroplating chemiplating, evaporative deposition techniques, or the like. The connection of electrical leads to the metallized contact regions can be conveniently accomplished by the well known theremo-compression bonding technique, the metallized contact regions preferably being of gold. Since no fluxes or additional bonding materials are used in the thermo-compression bonding technique, the aforementioned disadvantages of the use of solder are obviated. Other suitable techniques for bonding metallic means in low resistance ohmic contact to the solar cell front surface to provide the necessary front and back contacts will become apparent to those skilled in the art, as will other suitable back contact configurations. For example, one or more pillar like projections can be used, the pillars being at any convenient location and of any convenient surface configuration, the important consideration being that a great enough portion of the rectifying junction be substantially parallel to the light gathering front surface of the solar cell.

Although the hereinabove described embodiment was of the type utilizing diffused junctions in a P type silicon crystal, this configuration was utilized only for purposes of illustration and the present invention cell configuration is equally usable with other semi-conductor materials, whether of P or N type conductivity, and is not restricted to diffused junctions. For example, the present invention technique is equally applicable for use with the recently developed epitaxial growth type of junction.

Thus there has been described an improved solar cell configuration of the type wherein the external electrical circuit is completed across the rectifying junction, the present invention solar cell configuration being characterized by having all electrical contacts on the light gathering front surface thereof. This particular type of cell configuration enables a significantly higher packing density of solar cells in a matrix. For example, the typical prior art matrix configuration utilizing 1 x 2 cm. or 2 x 2 cm. solar cells had achieved a minimum cell spacing of about 35–40 mils, a metal tab sandwiched between two sheets of insulating material projecting between adjacent cells. Utilizing the present invention solar cell configuration in such a matrix, a minimum cell spacing on the order of only 5 mils is readily achievable, since only a single sheet of insulating material is necessary between adjacent cells, thereby enabling a significant increase in current collection efficiency for a given matrix surface area. Furthermore, since the back contact of the present invention photo cell is readily accessible, the repair of defective cells in a matrix is rendered possible and cell replacement made much easier.

Although the invention has been described with a certain degree of particularity, it is understood that the present disclosure has been made only by way of example and that numerous changes in the details of construction and the combination and arrangement of parts may be resorted to without departing from the spirit and the scope of the invention as hereinafter claimed.

What is claimed is:

1. A solar cell comprising:

a unitary semiconductor crystal body of a predetermined conductivity type material defining a front surface and a back surface and including a first thin surface region extending across the entirety of said back surface and a second thin surface region extending across all but a small predetermined perimetric portion of said front surface, with the remainder of said crystal body defining a third region of said predetermined conductivity type material contiguous with and separating said first and second regions and having a pillar like portion terminating in said small predetermined perimetric portion of said front surface, said first region being a highly doped region of said predetermined conductivity type and having a sheet resistance not in excess of about 5 ohms per square, said second region being a highly doped region of the opposite conductivity type and being sufficiently thin to be appreciably transparent to solar radiation;

first metallic means bonded in low resistance ohmic contact to said front surface within said second surface region to provide an electrical front contact for conductive connection to an external circuit; and, second metallic means bonded in low resistance ohmic contact to said front surface within said small predetermined perimetric portion and spaced apart from said second surface region to define an electrical back contact for conductive connection to an external circuit.

2. A solar cell as defined in claim 1, wherein said unitary semiconductor crystal body is of a substantially rectangular shape, and wherein said small predetermined perimetric portion of said front surface is a corner portion.

3. A solar cell comprising:

a substantially rectangular unitary semiconductor crystal body of a predetermined conductivity type defining front and back surfaces and including a first thin surface region extending across the entirety of said back surface and a second thin surface region extending across all but two small predetermined corner portions of said front surface, with the remainder of said crystal body defining a third region of said predetermined conductivity type material contiguous with and separating said first and second regions and having two pillar like corner portions terminating in said small predtermined corner portions of said front surface, said first region being a highly doped region of said predetermined conductivity type and having a sheet resistance not in excess of about 5 ohms per square, said second region being a highly doped region of the opposite conductivity type and being sufficiently thin to be appreciably transparent to solar radiation;

first metallic means bonded in low resistance ohmic contact to said front surface within said second surface region to provide an electrical front contact for conductive connection to an external circuit;

second metallic means bonded in low resistance ohmic contact to said front surface within one of said small predetermined corner portions and spaced apart from said second surface region to define an electrical back contact for conductive connection to an external circuit; and, third metallic means bonded in low resistance ohmic contact to said front surface within the other one of said small predetermined corner portions and spaced apart from said second surface region to define another electrical back contact for conductive connection to an external circuit.

References Cited

UNITED STATES PATENTS

| | | | |
|---|---|---|---|
| 2,114,591 | 4/1938 | Clark. | |
| 2,669,635 | 2/1954 | Pfann. | |
| 2,794,846 | 6/1957 | Fuller. | |
| 2,811,658 | 10/1957 | Moore. | |
| 2,999,240 | 9/1961 | Nicoll | 136—89 |
| 3,020,412 | 2/1962 | Byczkowski. | |
| 3,064,132 | 11/1962 | Strull | 250—211 |
| 3,070,466 | 12/1962 | Lyons | 148—187 X |

ALLEN B. CURTIS, *Primary Examiner.*